(12) United States Patent
Anderson et al.

(10) Patent No.: US 9,680,473 B1
(45) Date of Patent: Jun. 13, 2017

(54) ULTRA DENSE VERTICAL TRANSPORT FET CIRCUITS

(71) Applicant: INTERNATIONAL BUSINESS MACHINES CORPORATION, Armonk, NY (US)

(72) Inventors: Brent A. Anderson, Jericho, VT (US); Albert M. Chu, Nashua, NH (US); Edward J. Nowak, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/046,863

(22) Filed: Feb. 18, 2016

(51) Int. Cl.
| | |
|---|---|
| *H03K 19/09* | (2006.01) |
| *H01L 27/02* | (2006.01) |
| *H03K 19/0944* | (2006.01) |
| *H01L 29/78* | (2006.01) |
| *H03K 19/20* | (2006.01) |
| *H01L 27/092* | (2006.01) |

(52) U.S. Cl.
CPC ..... *H03K 19/0944* (2013.01); *H01L 27/0207* (2013.01); *H01L 27/092* (2013.01); *H01L 29/7827* (2013.01); *H03K 19/20* (2013.01)

(58) Field of Classification Search
CPC ........... H01L 29/7831; H01L 29/66666; H01L 29/66712; H01L 29/732; H01L 29/7802; H01L 29/7827; H01L 29/8083; H01L 27/0207; H03K 19/0944; H03K 19/20
See application file for complete search history.

(56) References Cited

U.S. PATENT DOCUMENTS

| | | | |
|---|---|---|---|
| 3,823,353 A | 7/1974 | Berger et al. | |
| 4,329,700 A | 5/1982 | Tanaka | |
| 4,523,216 A | 6/1985 | Shiotari | |
| 4,740,826 A | 4/1988 | Chatterjee | |
| 5,414,288 A | 5/1995 | Fitch et al. | |
| 5,612,563 A | 3/1997 | Fitch et al. | |
| 6,075,268 A | 6/2000 | Gardner et al. | |
| 6,118,159 A | 9/2000 | Willer et al. | |
| 6,744,082 B1* | 6/2004 | Forbes .............. | H01L 21/28273 257/213 |
| 8,174,070 B2* | 5/2012 | Mallikarjunaswamy | H01L 21/823807 257/331 |

(Continued)

*Primary Examiner* — Vibol Tan
(74) *Attorney, Agent, or Firm* — Cantor Colburn LLP; Steven Meyers

(57) ABSTRACT

Logic circuits, or logic gates, are disclosed comprising vertical transport field effect transistors and one or more active gates, wherein the number of $C_{PP}$'s for the logic circuit, in isolation, is equal to the number of active gates. The components of the logic circuit can be present in at least three different vertical circuit levels, including a circuit level comprising at least one horizontal plane passing through a conductive element that provides an input voltage to the one or more gate structures and another conductive element that provides an output voltage of the logic circuit, and another circuit level that comprises a horizontal plane passing through a conductive bridge from the N output to P output of the field effect transistors. Such logic circuits can include single-gate inverters, two-gate inverters, NOR2 logic gates, and NAND3 logic gates, among other more complicated logic circuits.

18 Claims, 7 Drawing Sheets

(56) References Cited

U.S. PATENT DOCUMENTS

| | | | |
|---|---|---|---|
| 9,312,388 B2* | 4/2016 | Xie | H01L 29/78 |
| 2001/0017392 A1* | 8/2001 | Comfort | H01L 21/823885 |
| | | | 257/410 |
| 2011/0075470 A1* | 3/2011 | Liaw | G11C 8/16 |
| | | | 365/154 |
| 2013/0164891 A1 | 6/2013 | Bryant et al. | |

* cited by examiner

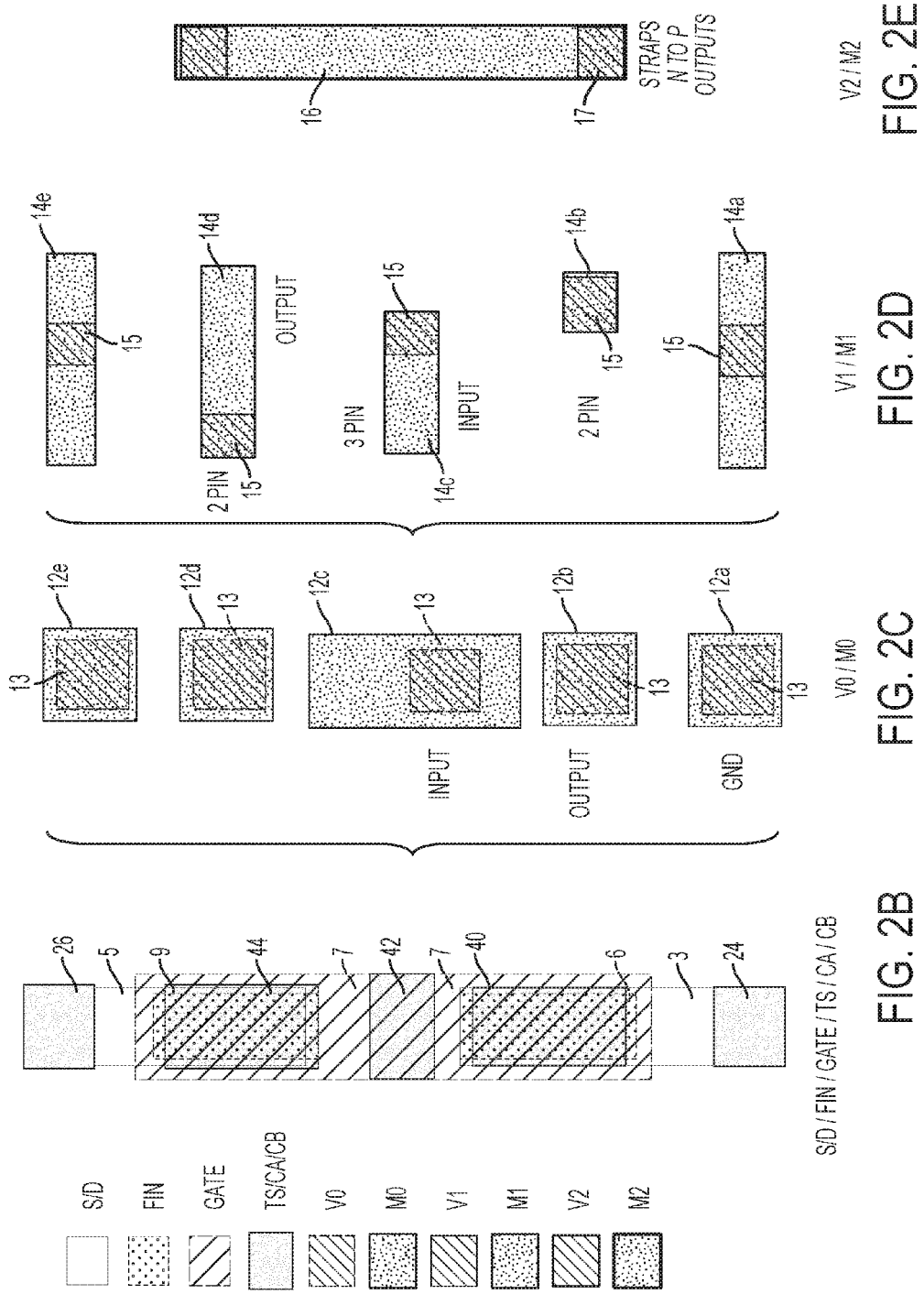

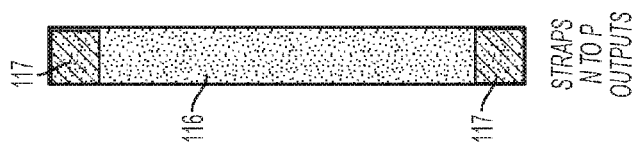
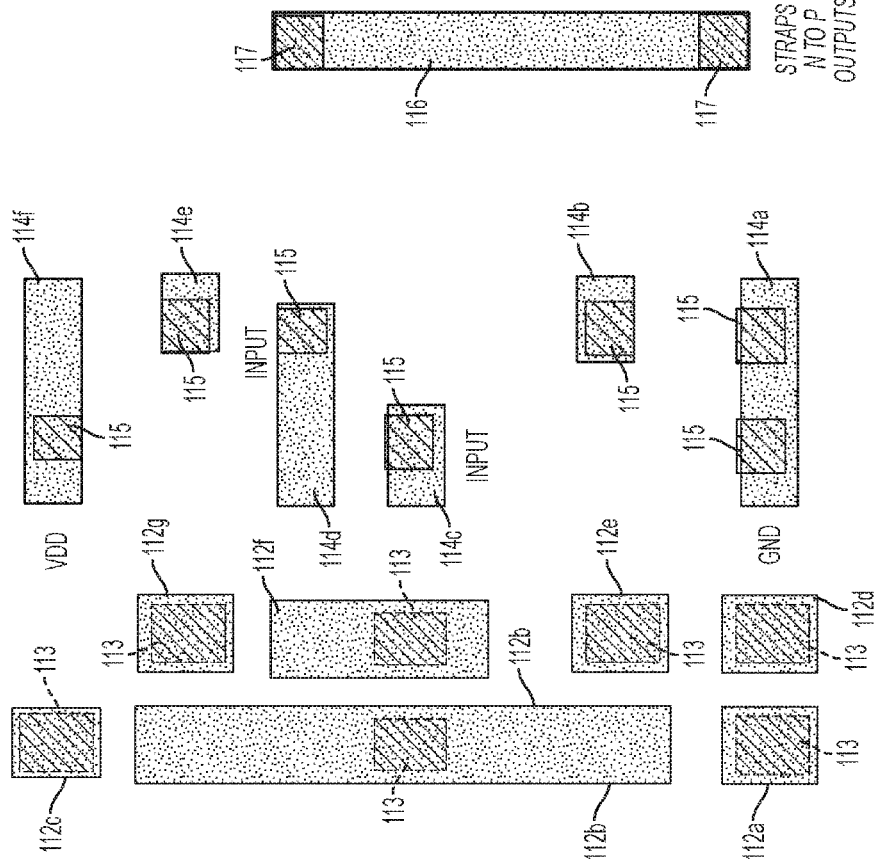
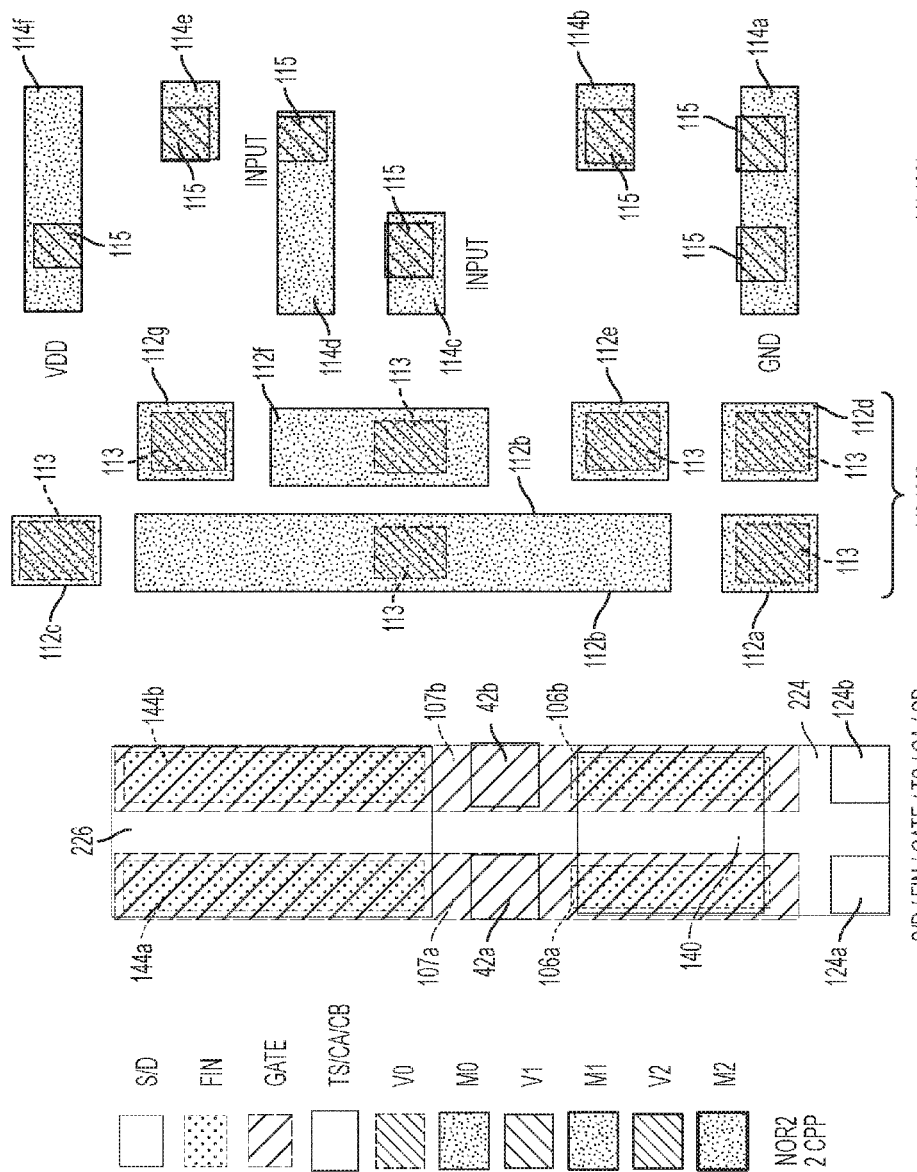

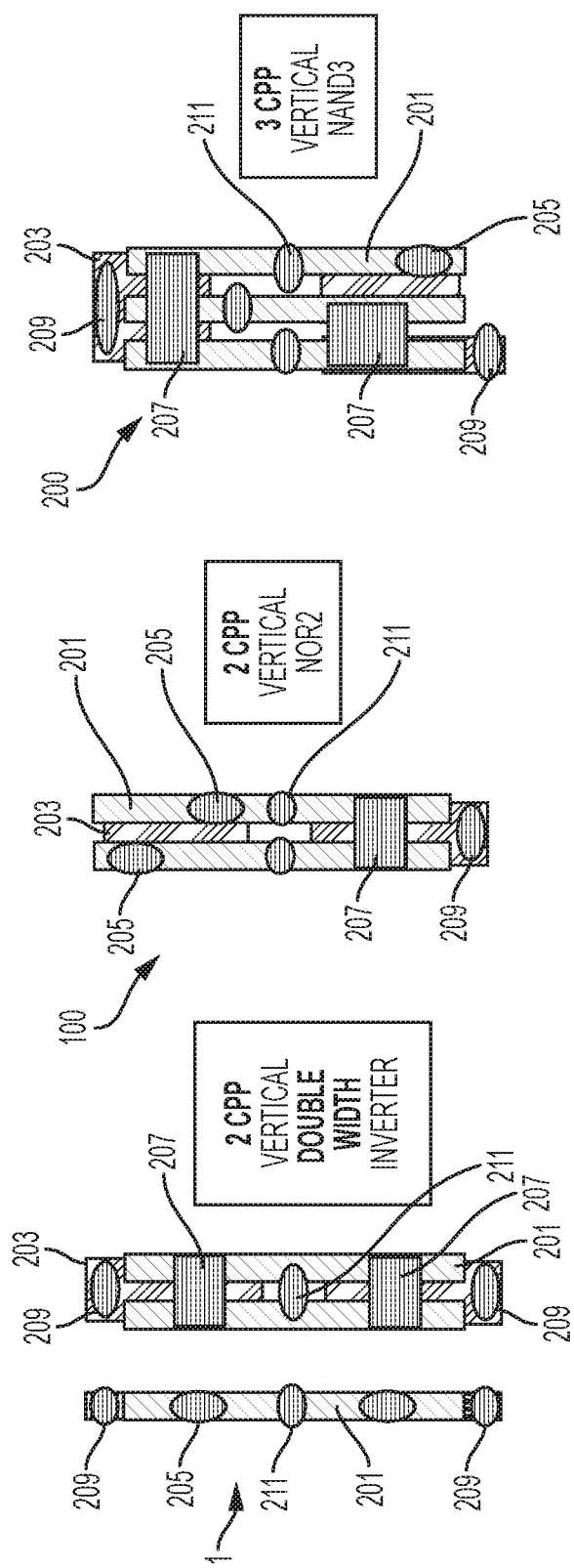

ULTRA DENSE VERTICAL TRANSPORT FET CIRCUITS

BACKGROUND

The present invention relates to logic circuits or associated devices comprising field-effect transistors and, more specifically, to logic circuits comprising vertical transport field effect transistors for reducing the footprint of logic circuits.

Digital logic circuits, also referred to as logic gates, are the building blocks of digital electronics and integrated circuits. A commonly used digital logic circuit is an inverter. Other fundamental logic circuits can include, among others, NAND and NOR circuits, wherein an accompanying number, such as the "3" in NAND3, can indicate the number of active gates in the logic circuit. Each of these logic circuits can perform a different logical operation. In a standard cell library, a number of transistors can be connected either in series and/or in parallel to perform NAND, NOR and other complex Boolean functions.

Complementary metal oxide semiconductor (CMOS) technology is currently the dominant technology for the manufacture of inverters and other logic gates used in digital integrated circuits, including microprocessors, microcontrollers, or static random access memory (SRAM). The word "complementary" refers to the fact that a typical CMOS circuit may use complementary pairs of hole-type (positive) and electron-type (negative) FETs (field effect transistors), i.e., p-FETs and n-FETs, respectively. The n-FET uses electrons as the current carriers in combination with n-doped source and drain junctions. The p-FET uses holes as the current carriers in combination with p-doped source and drain junctions. CMOS technology can offer low static power consumption and high noise immunity, when compared to other digital technologies.

An FET (also referred to as MOSFET) is a field effect transistor that can be used for amplifying or switching electronic signals. The MOSFET has a source, a drain, and a gate electrode. The gate electrode can comprise a conductive gate that is electrically insulated from the main semiconductor n-channel or p-channel by a thin layer of insulating material, for example, silicon dioxide, which makes the input resistance of the MOSFET relatively high. The gate voltage controls whether the path from drain to source is an open circuit ("off") or a resistive path ("on").

Vertical Transport FETs (VTFETs) are a promising alternative to standard lateral FET structures due to potential benefits, among others, in terms of reduced circuit footprint. In this type of structure, the current flow is perpendicular to a supporting wafer, unlike the lateral current flow in lateral FETs. A logic circuit comprising VTFETs can be referred to as a "vertical transport logic gate."

In other words, VTFETs can potentially provide electronic devices comprising logic circuits with improved circuit density. Such logic circuits can be characterized by a lower-number $C_{PP}$ (cell gate pitch) versus comparable logic circuits comprising lateral FET layouts. Minimum wiring pitch can also be relevant for realizing denser vertical FET layouts.

Although VTFETs are a promising alternative to conventional lateral FET structures for use in logic circuits, a challenge has been the circuit and layout-level implications of employing VTFETs in integrated circuits.

SUMMARY

An aspect of the present invention is a logic circuit comprising vertical transport field effect transistors and one or more active gates, wherein the number of $C_{PP}$'s for the logic circuit (in isolation) is equal to the number of active gates. Such logic circuits can include logic gates selected from the group consisting of one-$C_{PP}$ inverters that comprise only one active gate; two-$C_{PP}$ NOR logic gates that comprise only two active gates, three-$C_{PP}$ NAND logic gates that comprise only three active gates, and combinations thereof.

Another aspect of the present invention is a logic circuit comprising a logic gate selected from the group consisting of one-$C_{PP}$ vertical transport inverters, two-$C_{PP}$ double-width vertical transport inverters, two-$C_{PP}$ NOR vertical transport logic gates, and three-$C_{PP}$ NAND vertical transport logic gates, and combinations thereof, wherein each of said logic circuits comprise vertical transport field effect transistors, wherein the two-$C_{PP}$ double-width vertical transport inverter is comparable (i.e., equivalent or essentially identical) in function to a three-$C_{PP}$ inverter in which the field effect transistors are planar (lateral), wherein the two-$C_{PP}$ NOR vertical transport logic gate is comparable in function to a four-$C_{PP}$ NOR logic gate in which the field effect transistors are planar, and wherein the three-$C_{PP}$ NAND vertical transport logic gate is comparable in function to a five-$C_{PP}$ logic gate in which the field effect transistors are planar.

Another aspect of the present invention is directed to a logic circuit comprising a first vertical transport field effect transistor and a second vertical transport field effect transistor, each having source/drain regions on vertically opposing sides of a gate structure and a vertical fin extending vertically upwards, with respect to the supporting substrate of the vertical logic circuit, from a bottom source/drain region to a top drain/source region; one or more gate structures; wherein components of the logic circuit are present in at least three different and distinct vertical levels, namely a Level FET comprising at least one horizontal plane (i.e., x-y plane) passing through the fins of the first and second vertical transport field effect transistors, Circuit Level M1, and Circuit Level M2. Circuit Level M1 comprises at least one horizontal plane through a conductive element that provides an input voltage to the one or more gate structures and another conductive element that provides an output voltage of the logic circuit; Circuit Level M2 comprises at least one horizontal plane through a conductive element that forms a conductive bridge from the N output to P output of the vertical transport field effect transistors; wherein Circuit Level M2 is vertically above and separate from Circuit Level M1, and wherein Circuit Level M1 is vertically above and separate from Level FET.

Another aspect of the invention is directed to a NOR vertical transport logic gate comprising: a plurality of vertical transport field effect transistors, each having source/drain regions on vertically opposing sides of a gate structure and a vertical fin extending vertically upwards, with respect to the supporting substrate of the vertical inverter, from a bottom source/drain region to a top drain/source region; two separate gate structures having different inputs; wherein components of the logic circuit are present in at least three different vertical levels, namely a Level FET comprising at least one horizontal plane through the fins or gates of the vertical transport field effect transistors, Circuit Level M1, and Circuit Level M2. Circuit Level M1 comprises at least one horizontal plane through conductive elements that provide an input voltage to the gate structures and another conductive element that provides an output voltage of the logic circuit; Circuit Level M2 comprises at least one horizontal plane through a conductive element that forms a conductive bridge from the N output to P output of the field effect transistors, wherein Circuit Level M2 is vertically above and separate from Circuit Level M1, and wherein Circuit Level M1 is vertically above Level FET. The NOR vertical transport logic gate is a two-$C_{PP}$ NOR vertical transport logic gate that is comparable in function to a four-$C_{PP}$ NOR logic gate in which the field effect transistors are planar.

Still another aspect of the invention is directed to a NAND3 vertical transport logic circuit comprising a plurality of vertical transport field effect transistors, each having source/drain regions on vertically opposing sides of a gate structure and a vertical fin extending vertically upwards (with respect to the supporting substrate of the vertical logic circuit) from a bottom source/drain region to a top drain/source region; three separate gate structures each having a voltage input; wherein components of the logic circuit are present in at least three different vertical levels, namely a Level FET comprising at least one horizontal plane through the fins or gates of the vertical transport field effect transistors, Circuit Level M1, and Circuit Level M2. Circuit Level M1 comprises at least one horizontal plane passing through a conductive element that provides an input voltage to at least one, or all, of the gate structures and another conductive element that provides an output voltage of the logic circuit; Circuit Level M2 comprises at least one horizontal plane through a conductive element that forms a conductive bridge from the N output to P output of the field effect transistors; and Circuit Level M2 is vertically above and separate from Circuit Level M1, and Circuit Level M1 is vertically above and separate from Level FET. The NAND vertical transport logic circuit is a three-$C_{PP}$ logic gate that is comparable in function to a five-$C_{PP}$ logic gate in which the field effect transistors are planar.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

FIGS. 2B, 2C, 2D, and 2E, in combination, depict an exploded view of the inverter structure of FIG. 2A, whereas FIG. 2B depicts a top plan view of a lower portion of the inverter structure of FIG. 2A; FIG. 2C depicts a top plan view of a lower-middle portion of the inverter structure of FIG. 2A; FIG. 2D depicts an upper-middle portion of the inverter structure of FIG. 2A; and FIG. 2E represents an upper portion of the inverter structure of FIG. 2A;

FIGS. 3B, 3C, 3D, and 3E, in combination, depict an exploded view of the structure of the NOR2 logic gate of FIG. 3A, wherein FIG. 3B depicts a top plan view of a lower portion of the structure of FIG. 3A; FIG. 3C depicts a top plan view of a lower-middle portion of the structure of FIG. 3A; FIG. 3D depicts an upper-middle portion of the structure of FIG. 3A; and FIG. 3E represents an upper portion of the structure of FIG. 3A, in accordance with an embodiment of the present invention.

FIGS. 4A, 4B, and 4C diagrammatically depict top plan views of, respectively, a one-$C_{PP}$ vertical transport inverter alongside a two-$C_{PP}$ vertical transport double-width inverter, a two-$C_{PP}$ vertical transport NOR2 logic gate, and a three-$C_{PP}$ vertical transport NAND3 logic gate, showing the successive addition of active gates and VTFETs while using a layout design in accordance with embodiments of the present invention.

FIGS. 5A and 5B diagrammatically compare the $C_{PP}$ associated with logic gates comprising vertical transport FETs, in accordance with present embodiments, to the $C_{PP}$ of logic gates comprising planar FETs, in accordance with prior art, wherein FIG. 5A diagrammatically depicts top plan views of a combination of logic gates, and associated $C_{PP}$'s, comprising VTFETs, which logic gates consist of (from left to right) a first one-$C_{PP}$ inverter, a second one-$C_{PP}$ inverter, a two-$C_{PP}$ NOR2 logic gate, a third one-$C_{PP}$ inverter, and a fourth one-$C_{PP}$ inverter, and wherein FIG. 5B depicts top plan views of a combination of logic gates, and associated $C_{PP}$'s, comprising planar FETs, which logic gates consist of (from left to right) two three-$C_{PP}$ inverters.

DETAILED DESCRIPTION

Figure 1:
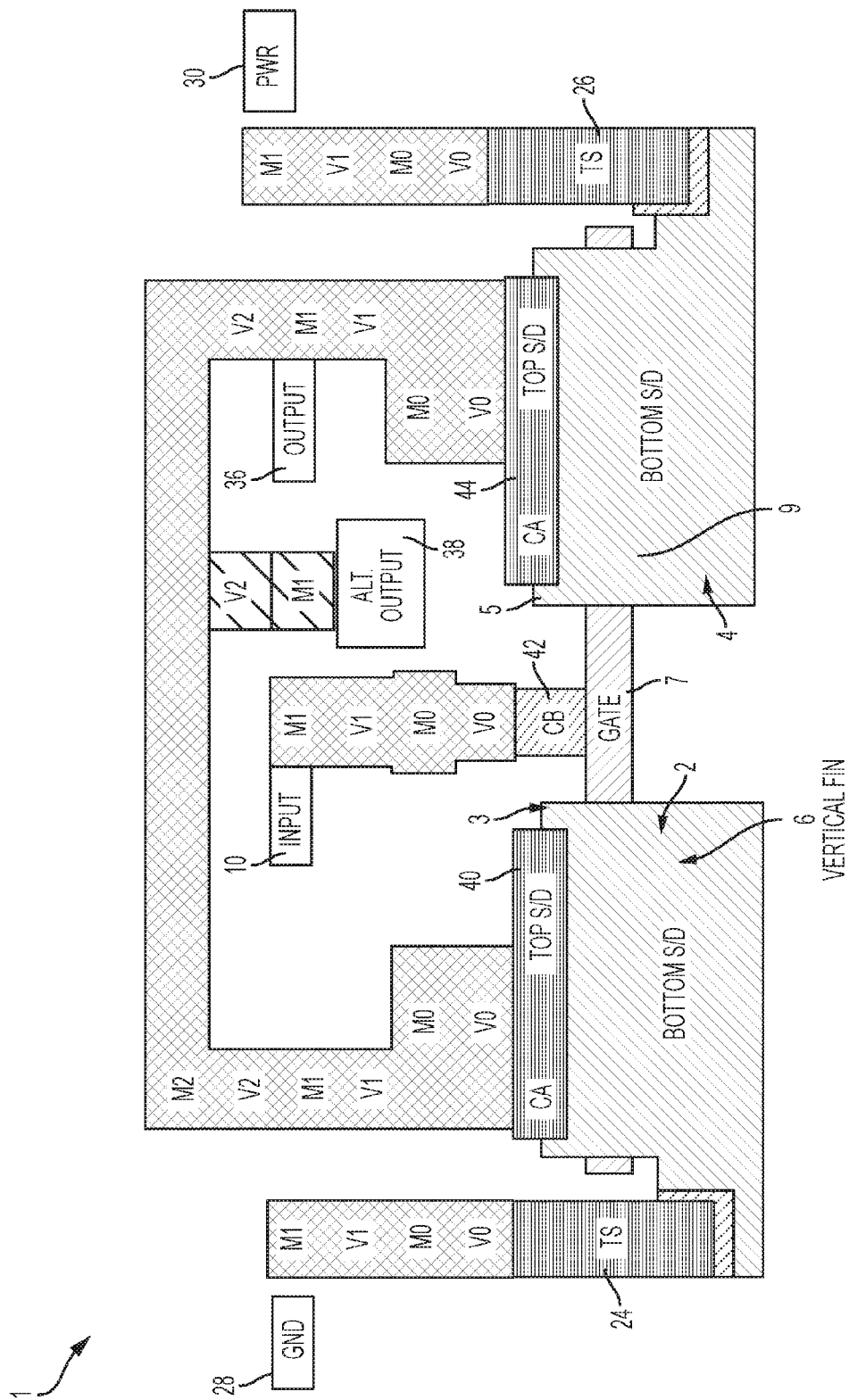
FIG. 1 is a cross-sectional diagrammatical side view of a layout of an embodiment of a one-$C_{PP}$ vertical transport inverter comprising vertical transport field effect transistors (VTFETs), in accordance with one embodiment of the present invention.

By utilizing VTFETs and associated circuit layouts to obtain novel logic circuits, Applicants have been able to reduce the number of extra diffusion breaks necessary in an integrated circuit. Advanced CMOS logic circuits require diffusion breaks to isolate the source/drain regions from adjacent FETs. Depending on the isolation technique employed, the penalty can be one to two extra diffusion breaks for each isolated circuit. This penalty is most significant for low drive-products such as mobile devices.

The logic circuits disclosed herein include, among others, single-$C_{PP}$ inverter circuits, two-$C_{PP}$ NOR2 logic circuits, and three-$C_{PP}$ NAND3 logic circuits. The elimination of diffusion breaks for these very low drive circuits can significantly improve product density. The term "$C_{PP}$" means cell gate pitch.

For use the interpretation of the claims and the specification, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Detailed embodiments of the structures of the present disclosure are described herein. However, it is to be understood that the disclosed embodiments are merely illustrative of the disclosed structures that may be embodied in various forms. In addition, each of the examples given in connection with the various embodiments of the disclosure is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For the purposes of the description hereinafter, the terms "upper", "lower", "top", "bottom", "left," and "right," and derivatives thereof can relate, based on context, to the disclosed structures, as they are oriented in the drawing figures. The same numbers in different figures can refer to the same structural component or part thereof.

As indicated above, logic circuits (gates) characterized by reduced circuit footprints and higher circuit density can be produced in accordance with present embodiments. Various techniques for characterizing circuit density exist. For example, CMOS manufacturing processes can be characterized by their technology node, wherein a technology node is defined as half the distance between identical features in an array, i.e., the half pitch. Specifically, for example, a 45 nanometer (nm) technology node corresponds to a CMOS memory cell having a half pitch of 45 nm. Based on such a parameter, continuous down scaling of CMOS processes can be anticipated in the near future.

Other parameters for characterizing layout density can include metal pitch (electrical width across active region), cell pitch (width) measured using fin pitch and gate pitch, and cell pitch (height) measured between $V_{DD}$ (positive supply voltage to FET) and ground rails, among other parameters or references. For example, gate pitch can be defined to be equal to: (distance between uncontacted gates)/2. More specifically, a pitch can be determined by adding the space between two features to the width of one of the features, creating an allowable "pitch."

For purposes of comparing the circuit density of the present vertical transport logic circuits or structures to comparable conventional lateral transport logic circuits, however, circuit footprints can be advantageously characterized by their "cell gate pitch" or $C_{PP}$, based on a gridded design in which elements of the inverter or other circuit can lay on a grid that can be referred to as a Layout Base Unit (LUB). Placement grids must be multiples of a designated LBU grid, for example, one-$C_{PP}$, two-$C_{PP}$, and three-$C_{PP}$ logic gates. $C_{PP}$ can also be used to represent cell poly pitch, but $C_{PP}$, as used herein is not limited to polysilicon gates, but rather generally applies to all relevant active gate materials, as will be appreciated by the skilled artisan.

In particular, planar inverters, with optimized wiring, typically take two to three $C_{PP}$'s versus one $C_{PP}$ for inverters with vertical transport transistors. Comparable planar NOR2 circuits require three to four $C_{PP}$'s versus two $C_{PP}$ for NOR2 circuits with vertical transistors, as further described herein.

Accordingly, for example, cell gate pitch of NAND3 logic circuits (or "logic gates") that are disclosed herein can equal an integer times ("X") gate pitch or three $C_{PP}$. Likewise, the cell gate pitch of a simple inverter cell can equal an integer times the gate pitch P, which is two $C_{PP}$. Accordingly, by using the embodiments of the present invention, the cell gate pitch of a logic circuit can be reduced from three $C_{PP}$ in conventional circuits to two $C_{PP}$ in the disclosed embodiments described hereafter. Specifically, for example, four-$C_{PP}$ conventional logic circuits can be reduced to a two-$C_{PP}$ logic circuit, and a five-$C_{PP}$ conventional logic circuit can be converted to a three-$C_{PP}$ logic circuit in accordance with embodiments of the present invention.

In particular, novel circuit designs for logic circuits are herein described that comprise vertical FETs, which designs allow for single-$C_{PP}$ isolated inverters and two-$C_{PP}$ isolated inverters. Other logic circuits can include two-$C_{PP}$ NOR2 logic circuits and three-$C_{PP}$ NAND3 logic circuits utilizing VTFETS and novel circuit layouts disclosed herein, in which extra diffusion breaks can be avoided.

The elimination of diffusion breaks for these logic circuits can significantly improve product density. Diffusion breaks can significantly degrade circuit density, especially for lower drive circuits. This problem is becoming worse, since more advanced nodes, due to process limitations, are moving towards double diffusion breaks.

Although a vertical transistor structure, in part, can provide an advantage in terms of reduced device footprint, the circuit level also needs to be considered. This is because, due to stacked source and drain regions in vertical FETs, layout restrictions such as infeasibility of connecting some contacts can lead to a larger layout area.

Before replacing lateral FETs with vertical VTFETs in logic gates, therefore, careful attention must be given to the interconnection between transistors and other layout features. It is desirable to provide an interconnect scheme, for connecting various features on one elevation (topological) level to features on another level, that can contribute to circuit density.

Furthermore, logic gates in an integrated circuit can comprise FETs interconnected in various ways. For example, combinatorial logic circuits can include NAND gates, NOR gates, and other such logic gates. Conductive elements in the integrated circuit can be connected in various ways to achieve a stated logic goal.

In some embodiments, two transistors can be mutually connected. For example, a one-$C_{PP}$ ("single-finger" or "single-gate") inverter arrangement can employ a pair of PMOS and NMOS transistors having a single input conductor linking gate conductors of the transistor pair. Likewise, NAND and NOR logic gates can employ pairs of PMOS and NMOS transistors, wherein the gate conductors of each pair are linked by a single input conductor.

Referring to FIG. 1, a cross-sectional side view of a layout of a vertical one-$C_{PP}$ vertical transport inverter 1 is depicted. This inverter comprises two vertical transport field effect transistors (VTFETs), each comprising first source and drain regions 2 and 3 and second source and drain regions 4 and 5 (whereas when one of the regions in a VTFET functions as a source, the other of the two functions as a drain, as will be readily appreciated by the skilled artisan). The source and drain regions in VTFETs can be referred to as source/drain regions or S/D regions.

The VTFETs in FIG. 1 further comprise a gate structure 7 (in this case, a mutual or common gate) that can comprise gate conductor and gate dielectric components (not shown) and which is contiguous around VTFET first vertical fin 6 and second vertical fin 9 which are located vertically between, respectively, relatively lower first and second source/drain regions 2/4 and relatively upper first and second source/drain regions 3/5. It will be understood that each vertical fin is contiguous with, electrically connected to, respective S/D regions. In particular, each vertical fin 6 and 9 forms a semiconductor channel between opposing S/D regions. The vertical fins 6 and 9 can be surrounded by the gate structure 7 on at least one, specifically all four sides, in which case the gate structure can be referred to as a wrap-around gate.

An electric field can be used to control the electrical conductivity of the channel formed by the semiconductor material of vertical fins 6 and 9 in the two VTFETS of FIG. 1, as can be appreciated by the skilled artisan.

A voltage input 10 to the VTFETs is indicated above the gate 7 common to both first and second VTFETs in FIG. 1. The voltage input, or a metal track for that purpose, is connected to a conductive element in Circuit Level M1 of the inverter. The term "Circuit Level M1" indicates a vertical height level that is distinctly different from and relative to the vertical heights of Circuit Level M0, Circuit Level M1, and Level FET, hereafter to be described. From lower to upper levels, Level FET and Circuit Levels M0, M1 and M2 in FIG. 1 refer, respectively, to vertical levels. Each of the circuit levels can comprise one or more circuit "layers" in the one-$C_{PP}$ inverter. A horizontal (x-y) plane passing through a circuit layer in a level is vertically separated from a horizontal plane passing through a circuit layer in a different circuit level. In an embodiment, one or more circuit layers in each level are vertically positioned relative to the one or more other layers in the other indicated levels. Each circuit layer can be in a single level, but the number of circuit layers (each comprising a conductive element) can be a greater number than shown for the levels of the one-$C_{PP}$ inverter of FIG. 1.

In particular, referring to FIG. 1 again, Circuit Levels M0, M1, and M2 refer to different conductive circuit levels, each comprising one or more conductive elements (typically metal), which conductive elements are numbered in later FIGS., specifically FIGS. 2B, 2C, FIG. 2D, and FIG. 2E to be described. Levels V0, V1 and V2 in FIG. 1 refer to different levels of conductive vias ("via elements") to (or between) circuit levels and can comprise a plane through a dielectric, or insulating layer in each via level. For example, Via Level V0 is vertically between Level FET and Circuit Level M0, Via Level V1 is vertically between Circuit Level M0 and Circuit Level M1, and Via Level V2 is vertically between Circuit Level M1 and Circuit Level M2. In the inverter structure 1 of FIG. 1, Circuit Level M2 can connect the N voltage output of one VTFET to the P voltage output 36 of the other VTFET (and optionally also to the alternate voltage output 38 in FIG. 1).

In FIG. 1, S/D bottom contacts 24 and 26, for example comprising titanium silicide, tantalum silicide or the like (generically "TS") can be employed within trenches for connecting the bottom S/D regions 2 and 4, respectively, to the ground 28 and source of power 30 for the inverter 1. For example, such contacts can be prepared by depositing tantalum silicon at room temperature, followed by annealing at higher temperatures. Silicided molybdenum ($MoSi_2$), for example, can also be used within the trenches.

The contacts for top S/D regions, top contacts 40 and 44 (also referred to as top S/D contacts), are labelled as CA in FIG. 1, and the gate contact 42 is labeled CB in FIG. 1. Such contacts can, for example, comprise tungsten. The difference between CA and CB contacts primarily is that they can land on different types of surface and etched to different depths. For example, the CA contact can land on a silicided region, while the CB contact can contact a metal gate. In particular, top S/D contacts 40 and 44 can be employed for electrically connecting the tops of the S/D regions 3 and 5, respectively, to the voltage output 36 and optionally also alternate voltage output 38 of inverter 1.

The vertical transport (electrons or holes) in inverter 1 of FIG. 1 can occur in the following order, from lower to upper levels, starting from the bottom S/D regions, as follows: bottom contact, V0, M0, V1, and M1, as depicted in FIG. 1. The vertical transport in the inverter 1 can also occur in the following order, from lower to upper levels, starting from top S/D regions, as follows: top S/D contacts, V0, M0, V1, M1, V2 and M2, as also depicted in FIG. 1.

Figure 2A:
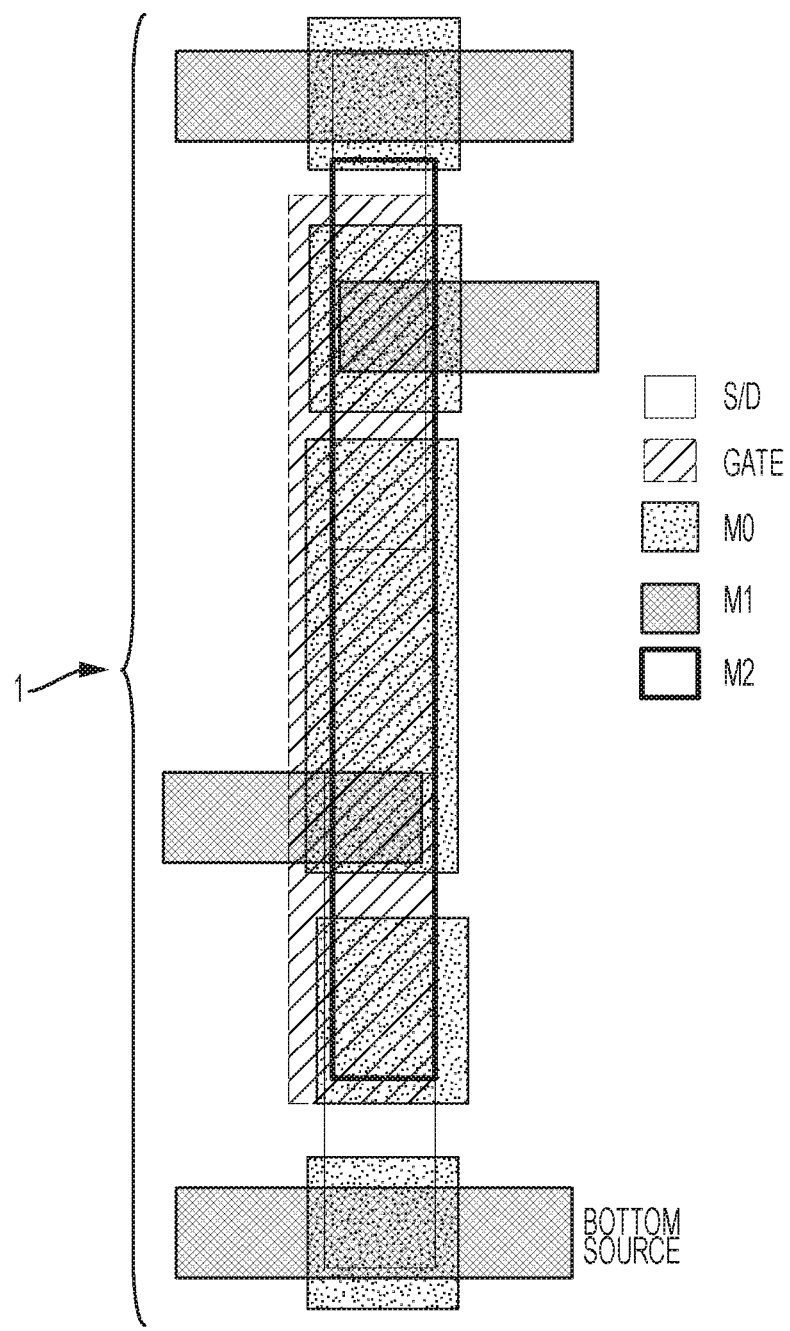
FIG. 2A is a top plan of the one-$C_{PP}$ vertical transport invertor of FIG. 1, depicting a top-down view of various components at various levels within the inverter, which top plan view is shown alongside a key for identifying various components and levels of the inverter.

Turning now to FIG. 2A, a see-through top-down view of various components at various levels within the inverter structure 1 is shown, alongside a key of patterns for identifying the various components or levels of the inverter. Thus, the S/D regions, gate, and conductive elements in the M0, M1, and M2 levels are shown in inverter structure 1 of FIG. 2A, as identified by the accompanying key.

In particular, FIG. 2A depicts a top-down see-through plan view of the one $C_{PP}$ vertical transport invertor of FIG. 1 and FIGS. 2B, 2C, 2D, and 2E, depict an exploded view of the inverter structure of FIG. 2A. To the left of FIGS. 2B, 2C, 2D and 2E, which together showing an exploded view of the inverter structure of previous FIG. 2A, reference is made to a key of patterns used in the accompanying FIGS., which key is similar, but not identical, to the key alongside inverter structure 1 in FIG. 2A.

In particular, FIG. 2B depicts a top plan view of the lowest vertical portion of the one-$C_{PP}$ vertical transport inverter of FIG. 2A. This lower portion comprises, but is not limited to, Level FET, which comprises at least portions of the VTFETs, including fins (6 and 9) and active gate 7. Level FET can be defined as a level distinct from the other mentioned levels, comprising at least one horizontal (x-y) plane that passes through the fins and gate of the VTFETs in the inverter logic circuit. Level FET is located vertically below Circuit Level M0, wherein Via Level V0 is vertically located between Level FET and Circuit Level M0. As evident in FIG. 2B, a lower portion of the inverter, including Level FET, can comprise the following components, in order from lower to upper vertical position: the top source/drain regions 3 and 5, first and second fins 6 and 9, and gate structure 7, wherein contacts 40, 42, 44 are shown vertically above the gate structure 7. Bottom contacts 24 and 26 are connected to bottom S/D regions, which regions are, accordingly hidden by the bottom contacts.

FIG. 2C depicts a lower-middle vertical portion of the inverter structure of FIG. 2A. In particular, FIG. 2C depicts a vertical portion comprising Circuit Level M0 and Via Level V0 of the one-$C_{PP}$ vertical inverter transfer inverter structure of FIG. 1 and FIG. 2A. The Circuit Level M0 comprises, but is not necessarily limited to, conductive elements 12 *a, b, c, d*, and *e*. Circuit Level M0 comprises at least one horizontal (x-y) plane through one, or all, of these conductive (e.g., metal) elements. The conductive vias 13 in FIG. 2C typically pass through a dielectric layer located between Level FET and Circuit Level M0. Circuit Level M0 is located vertically above Level FET and below Circuit Level M1, wherein Via Level V0 is vertically located between Level FET and Circuit Level M0. Specifically, Circuit Level M0 can comprise at least one, or all, of the following components: conductive element 12*a* connected indirectly (electrically) to ground in a different level, conductive element 12*b* connected indirectly to a conductive bridge (from the N output to P output) in a different level, conductive element 12*c* indirectly connected to input in a different level, conductive element 12*d* indirectly connected, in a different level, to a conductive bridge, and conductive element 12e indirectly connected (in terms of vertical transport) to power in a different level, which other levels are further described below.

FIG. 2D depicts an upper-middle vertical portion of the inverter structure of FIG. 2A, comprising Circuit Level M1 (and also Via Level V1). In particular, FIG. 2D depicts a vertical portion comprising components of Level M1 in a plan view of the one-$C_{PP}$ vertical inverter structure 1 of FIG. 2A. This vertical portion can comprise, but is not necessarily limited to, a vertical height Level M1 that, in turn, can comprise at least one, or all, of conductive element 14 a, b, c, d, and e. The Circuit Level M1 can comprise a horizontal (x-y) plane through at least one (or all) of the conductive elements 14 a, b, c, d, and e. Circuit Level M1 is located vertically above Circuit Level M0 and below Circuit Level M2, wherein Via Level V1 (comprising via elements 15) is vertically located between Circuit Levels M0 and M1.

As indicated in FIG. 2D, conductive elements in Circuit Level M1 can be electrically connected to a plurality of tracks, each track in reference to a "pin." For example, the embodiment of FIG. 2D shows a seven-pin library, although a higher or lesser number of pins can be employed. Via elements 13 in previous FIG. 2C, in Via Level V0, electrically connect conductive elements 12 a, b, c, d, and e, respectively, to conductive elements 14 a, b, c, d, and e in FIG. 2D.

Circuit Levels M0, M1, and M2 are distinct and separate topologically vertical levels. Circuit Level M1 in FIG. 2D can comprise the following components: conductive element 14a to ground (GND) in the same level, conductive element 14b to a conductive bridge in a different level, conductive element 14c to input to gate in the same level, conductive element 14d providing output in the same level, and conductive element 14e from power in the same level. Via elements 15 in FIG. 2D, in Via Level V1, can electrically connect conductive elements 14 a, b, c, d, and e to a conductive bridge shown in FIG. 2E.

FIG. 2E depicts an upper vertical portion of the inverter structure 1 of FIG. 2A, comprising Circuit Level M2 (and also Via Level V2). In particular, FIG. 2E depicts, in a plan view, a vertical portion, comprising Circuit Level M2 of the one-$C_{PP}$ vertical transport inverter structure of FIG. 2A. This vertical portion comprises, but is not necessarily limited to, a vertical height Circuit Level M2 comprising at least conductive element 16 (also referred to as "conductive bridge"). The Circuit Level M2 comprises a horizontal (x-y) plane through at least conductive element 16. Circuit Level M2 is located vertically above Circuit Level M1, wherein Via Level V2 is vertically located between Circuit Levels M2 and M1. As indicated earlier, the conductive bridge 16, in Level M2, provides N output to P output for the VFETs. Via elements 17 in FIG. 2E, in Via Level V2, electrically connect conductive elements 14b and 14d in previous FIG. 2D to conductive element 16 in FIG. 2E.

Figure 3A:
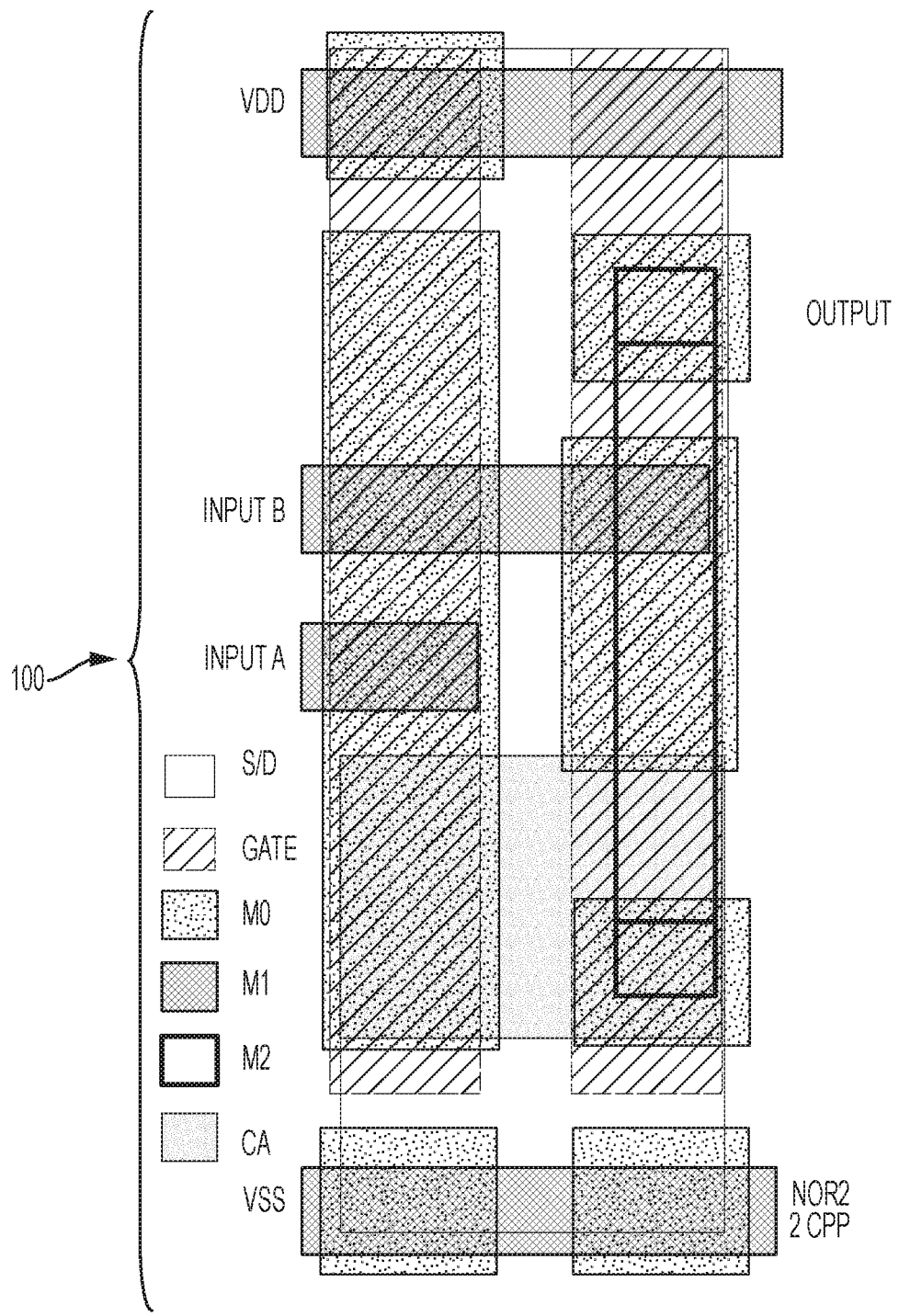
FIG. 3A diagrammatically shows a top plan view of an embodiment of a two-$C_{PP}$ vertical transport NOR2 logic gate, depicting a top-down view of various components and levels of the logic gate, which top plan view is shown alongside a key for identifying various components and levels of the logic gate.

Turning now to FIG. 3A, one embodiment of a two-$C_{PP}$ NOR2 vertical transport gate 100 is depicted in top transparent plan view, with various components and levels shown. The voltage to the drain $V_{DD}$, specifically a positive voltage, is shown at the top of FIG. 3A and the voltage to the source $V_{SS}$, specifically a negative voltage supply, is shown at the bottom of FIG. 3A.

It is readily apparent that the two-$C_{PP}$ NOR2 vertical transport logic gate 100 of FIG. 3A comprises (as further identified by the accompanying key in FIG. 3A) two gate structures. Thus, the S/D regions, gate, top contact CA common to two gates, and conductive elements corresponding to M0, M1, and M2 Circuit Levels are shown in inverter structure logic gate 100 of FIG. 2A, as identified by the accompanying key.

FIGS. 3B, 3C, 3D, and 3E, in combination, depict an exploded view of the logic gate of FIG. 3A. To the left of FIG. 3B, reference is made to a key of patterns used in the accompanying FIGS. 3B, 3C, 3D, and 3E, which key is similar, but not identical, to the key alongside the two-$C_{PP}$ NOR2 structure in FIG. 3A.

In particular, FIG. 3B shows a lower vertical portion of the two-$C_{PP}$ NOR2 vertical transport logic gate of FIG. 3A, including gates 107a and 107b, fins 106 a, b, wherein common top contact 140 is shown over a first pair of fins 106a and 106b and two contacts 144a and 144b over a second pair of fins (which fins are hidden by the contacts). Also shown are S/D regions 226 and 224 and bottom S/D contacts 124a and 124b.

As evident in FIG. 3B, the logic gate of previous FIG. 3A includes two gates 107a and 107b, as well as two voltage inputs to the gates via contacts 42a and 42b, respectively, wherein two VTFETs are connected in parallel and two VTFETs are connected in series. Other than the number of gates, however, the layout of the two-$C_{PP}$ logic gate of FIG. 3A can be considered similar and analogous in principle to the one-$C_{PP}$ inverter of FIG. 1. In particular, the two-$C_{PP}$ NOR2 vertical transport logic gate can likewise comprise different components in distinctly different vertical levels, which levels can be referred to as Level FET, Circuit Level M0, Circuit Level M1, and Circuit Level M2, essentially as defined above.

Thus, FIGS. 3B to 3E show, in combination, form an exploded view of vertical portions of the logic gate of FIG. 3A, in which Circuit Level M2 can be above Level M1. Specifically, Circuit Level M2 can also be above both Circuit Levels M1 and M0. Circuit Level M2 can also be above both Circuit Level M1 and Level FET. Finally, Circuit Level M2 can also be above Circuit Levels M1 and M0, wherein Circuit Level M0 is above Level FET.

As before, the two-$C_{PP}$ logic gate depicted in FIGS. 3A to 3E, having an additional gate compared to the one-$C_{PP}$ inverter, can be characterized by a Level FET. A Circuit Level M0, a Circuit Level M1, and a Circuit Level M2 (wherein each circuit level can comprise one or more circuit layers). The one or more circuit layers of one level are vertically positioned relative to the other indicated levels. Thus, the two-$C_{PP}$ logic gate of FIG. 3A can have more layers than the levels in the embodiment shown in FIG. 3A.

Specifically, in FIGS. 3B to 3E, depicting portions of the two-$C_{PP}$ NOR2 logic gate of FIG. 3A, Circuit Levels M0, M1, and M2 can refer to distinctly different circuit levels, each comprising different conductive elements, which can be numbered analogously to FIGS. 2B to 2E, but with the addition of the components associated with a second pair of VTFETs.

Referring now to FIG. 3C, a lower middle vertical portion of the two-$C_{PP}$ NOR2 vertical transport logic gate of FIG. 3A is depicted comprising conductive elements 112a, 112b, 112c, 112d, 112e, 112f, and 112g. Conductive via elements 113 are present in Via Level V0 connecting the latter conductive elements to conductive elements in the next higher Circuit Level M1, shown in the next FIG. 3D.

As shown in FIG. 3D, an upper-middle vertical portion of the two-$C_{PP}$ NOR2 vertical transport logic gate of FIG. 3A is depicted comprising, in Circuit Level M1, conductive elements 114a, 114b, 114c, 114d, 114e, and 114f and, in Via Level V1, conductive via elements 115.

As shown in FIG. 3E, an upper vertical portion of the two-$C_{PP}$ NOR2 vertical transport logic gate of FIG. 3A is depicted comprising conductive element (or "bridge") 116, in Circuit Level M2, connected by conductive via elements 117 to lower conductive elements shown in previous FIG. 3D.

Thus, in FIGS. 3C, 3D and 3E, different via elements (in levels V0, V1 and V2) are present leading to (or located between) circuit levels, specifically via elements 113 in FIG. 3C, via elements 115 in FIG. 3D, and via elements 117 in FIG. 3E. Each via level can include one or more conductive vias passing through an insulating material, or dielectric layer, and either connecting the conductive elements in two different circuit levels or (in the case of vias 113 in FIG. 3C) connecting a VFET to a circuit level.

As indicated by FIGS. 3A to 3E, in combination, and as with the one-$C_{PP}$ inverter of FIG. 1, the vertical transport in the NOR2 logic gate of FIG. 3A can occur in the following order, from lower to upper, from the bottom S/D regions: bottom contact, V0, M0, V1, and M1. Also, as before, vertical transport in the logic gate can occur in the following order, from lower to upper, from top S/D regions: S/D top contact, V0, M0, V1, M1, V2, and M2. In the structure of the logic gate 100 shown in FIG. 3A, Circuit Level M2 can connect N voltage output from one pair of VTFETs to P output of another pair of VTFETs.

As in the inverter logic gate, the NOR2 logic gate, or portions thereof, as illustrated in FIGS. 3A to 3E, comprises a Level FET that is located vertically below Circuit Level M0, wherein Via Level V0 is vertically located between Level FET and Circuit Level M0. Level FET can comprise at least one horizontal plane through the fins and/or gate structures of the VFETs. Circuit Level M0, comprising a lower vertical portion of the NOR2 logic gate above Level FET, can comprise at least one horizontal (x-y) plane through one or more conductive elements contained in that level. Circuit Level M0 is located vertically above Level FET and below Circuit Level M1, wherein Via Level V1 is vertically located between Circuit Levels M0 and M1. The Circuit Level M0 can comprise at least one, or all, of the following components: conductive element indirectly connected to ground in a different level, conductive element indirectly connected to, in a different level, a conductive bridge from the N output to P output, conductive element indirectly connected to, in a different level, output, and conductive element connected indirectly, in a different level, to power.

As shown if FIG. 3D, Circuit Level M1 in the NOR2 vertical transport logic gate of FIG. 3A can comprise conductive elements 114 a, b, c, d, e, and f, through at least one, or all, of which at least one horizontal plane can pass. Circuit Level M1 is located vertically above Circuit Level M0 and below Circuit Level M2, wherein via elements in Via Level V2 are vertically located between Circuit Levels M1 and M2. The Circuit Level M1 can comprise one or all of the following components: conductive element directly to ground in the same level, conductive elements directly from two inputs in the same level, conductive element in the same level directly to an output, a conductive element indirectly to, in a different level, a conductive bridge from the N output to P output, and conductive element directly to, in the same level, a source of power.

The Circuit level M2 comprises at least one horizontal (x-y) plane through conductive element 116 in FIG. 3E. Circuit Level M2 is located vertically above Circuit Level M1, wherein via elements in Via Level V2 are vertically located between Circuit Levels M2 and M1. The conductive element 116 in Circuit Level M2 comprises a conductive bridge from N output to P output for the VFETs.

In the vertical transport NOR2 logic gate 100 of FIG. 3A, Circuit Level M2 is above Circuit Level M1. Specifically, Circuit Level M2 can also be above both Circuit Levels M1 and M0. Circuit Level M2 can also be above Circuit Level M1 and Level FET. Finally, Circuit Level M2 can also be above Circuit Levels M1 and M0, wherein Circuit Level M0 is above Level FET. As defined herein, a horizontal plane through a level of the vertical transport logic gate is at a higher vertical height than a horizontal plane through a lower level of the vertical transport logic gate.

Further still, a three-$C_{PP}$ vertical transport NAND3 logic gate can be designed along the same lines as the NOR2 logic gate previously described. This is depicted in the progression of logic gates going from FIG. 4A to FIG. 4C, showing vertical transport logic circuitry progressively (left to right) evolving through the circuitry of one-$C_{PP}$ inverter 1 in FIG. 4A, to a two-$C_{PP}$ vertical NOR 2 gate 100 in FIG. 4B, to a three-$C_{PP}$ NAND3 logic gate 200 in FIG. 4C. Diagrammatically, the structures 201 in FIGS. 4A to 4C represent gate structures. The rectangular areas 203 under the gates 201 represent active bottom source/drain areas. The vertical ovals 205 over the gates 201 represent contacts to the top source/drain areas above the fins. The rectangles 207 over the gates also represent contacts to the top source/drain structures. The more elongated horizontal ovals 209 over the bottom source/drain areas represent contacts to the trenches in bottom source/drain regions, connected either to ground or power. The horizontal less-elongated ovals 211 over the gates represent contacts to the gates.

Thus, the three-$C_{PP}$ vertical transport NAND3 200 shown in FIG. 4C comprises a plurality of VTFETs in parallel or in series, wherein the three-$C_{PP}$ vertical transport NAND3 can be derived (by supplementing relevant elements and adjusting the arrangement, as will be appreciated by those skilled in the art) from the two-$C_{PP}$ vertical transport NOR2 of FIG. 4B, just as the two-$C_{PP}$ double-width vertical transport inverter of FIG. 4A can be derived from, alongside it, the one-$C_{PP}$ vertical transport inverter 1.

Still further logic circuits or combinations of logic gates can be constructed based on the designs of the one-$C_{PP}$ inverter, the two-$C_{PP}$ double width inverter, the two-$C_{PP}$ NOR2 logic gate, and the three-$C_{PP}$ NAND3 logic disclosed herein, as will be appreciated by the skilled artisan. For example, by appropriate flipping, forming a mirror image, and/or like operations, starting with a structure for the NAND3 logic gate, an analogous five-$C_{PP}$ vertical transport logic gate can be obtained. Accordingly, FIGS. 4 A, B, and C illustrate, from left to right, more complicated circuits being designed to include additional active gates, which can all employ the general layout design broadly disclosed herein.

For example, one specific configuration of a single CMOS SRAM cell, which stores a single bit of information, comprises six transistors: a first circuit having first and second complementary FETs; a second circuit having third and fourth complementary FETs; and two access FETs. The first and second circuits of the cells are cross-coupled to form a storage flip-flop, storing the one bit.

Figure 5B:
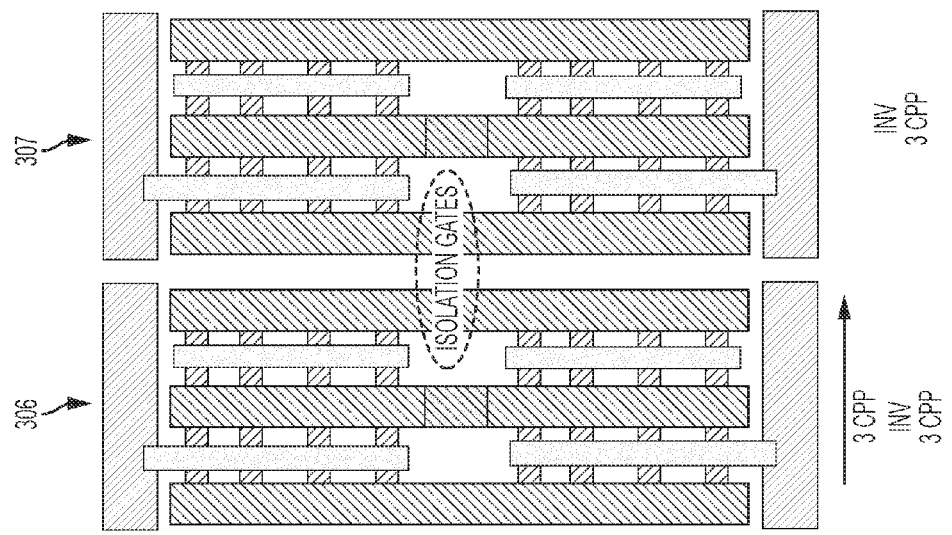
Figure 5A:
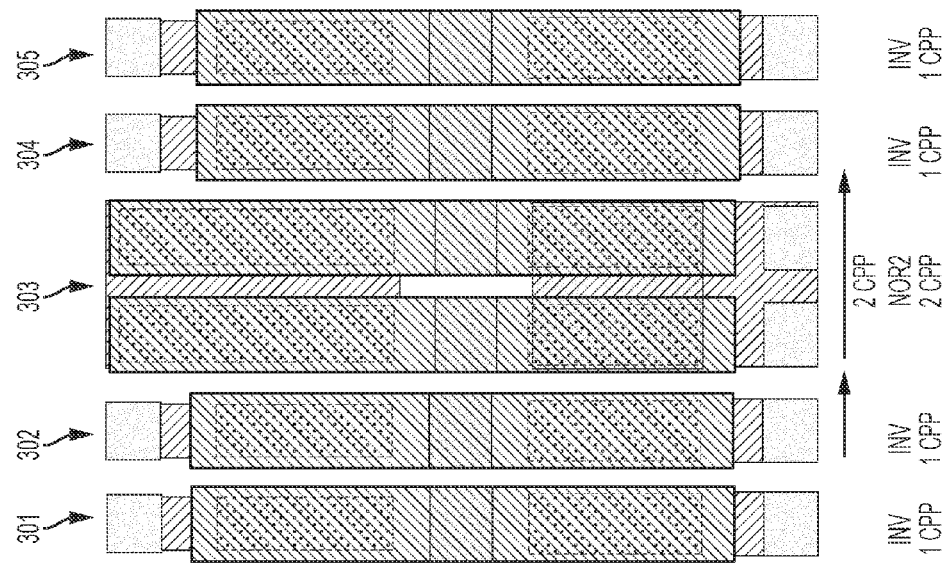

Turning now to FIGS. 5A and 5B, logic gates comprising vertical FETs, as disclosed herein, are compared to logic gates comprising planar FETs as disclosed in the prior art. In particular, FIG. 5A diagrammatically depicts top plan views of one embodiment of a plurality of vertical transport logic circuits comprising VTFETs, which logic circuits consist of (from left to right) a first one-$C_{PP}$ inverter 301, a second one-$C_{PP}$ inverter 302, a two $C_{PP}$ NOR2 logic gate 303, a third one-$C_{PP}$ inverter 304, and a fourth one-$C_{PP}$ inverter 305. As evident, no extra $C_{PP}$'s are required for wiring and isolation. In comparison, FIG. 5B depicts top plan views of a plurality of logic circuits comprising planar/lateral FETs, which logic circuits consist of (from left to right) a first three $C_{PP}$ inverter 306 and a second three-$C_{PP}$ inverter 307. As evident, extra $C_{PP}$'s are required for wiring and isolation, and isolation gates are indicated by the elongated oval between the two three-$C_{PP}$ inverters in FIG. 5B. Thus, FIG. 5A and FIG. 5B, in combination, provide a representative comparison between the $C_{PP}$'s required for logic gates employing VTFETS according to present embodiments and the $C_{PP}$'s required for wiring and isolation for comparable or identical logic gates employing planar/lateral FETs that require isolation gates (as shown in FIG. 5B).

In view of the above, another aspect of the invention is that the number of $C_{PP}$'s for an isolated logic gate, including NAND, NOR, and inverters can be equal to the number of active gates in the logic circuit. In particular, a logic gate with one active gate, for example a simple inverter, can be characterized by a one-$C_{PP}$ logic circuit, including the isolation to an adjacent logic circuit (i.e., in isolation). A logic gate with two active gates, for example, a two-gate inverter or NOR logic gate, can be characterized by a two-$C_{PP}$ circuit, including isolation to an adjacent logic circuit. A logic gate, with three active gates, for example a NAND logic gate can be characterized by a two-$C_{PP}$ circuit, including isolation to an adjacent logic circuit.

The above vertical transport circuit structures can be fabricated by conventional methods, as will be appreciated by the skilled artisan. For example, the substrate on which the VTFETs are supported, although not shown in the FIGS. for simplicity, can comprise a semiconductor substrate, specifically a silicon-based, single crystalline material doped either n-type or p-type. Arranged on the upper surface of the substrate can be various isolation structures (not shown), including the circuits herein disclosed. Isolation structures can be formed, for example, by a shallow trench process. In either event, isolation structures serve to isolate an active or passive device in one portion of substrate from an active or passive device within another portion of substrate.

The width of the contact trenches can generally vary. For example, the width of the contact trenches can be in a range from about 15 to about 100 nm, specifically 20 to about 50 nm. Contacts within the trenches can includes any material, or combination of materials, that provide a low contact resistance (e.g., a contact resistance lower than $1 \times 10^{-8}$ ohm·cm$^2$) when deposited. Such contacts can be formed by a chemical vapor deposition process (CVD), atomic layer deposition (ALD), or other suitable process. The total thickness of the contacts can vary and is not intended to be limited. For example, the total thickness of the contacts can be in a range from about 1 to about 15 nm.

Contacts for the source/drain regions can be formed with a contact metal. Non-limiting examples of suitable contact metals include aluminum, platinum, gold, tungsten, titanium, or any combination thereof. Such contact metal can be deposited by a known deposition process, for example, CVD, PECVD, PVD, plating, thermal or e-beam evaporation, and sputtering. The contact metal of the NFET (first VTFET transistor) can be the same or different from the contact element in the PFET (second VTFET).

Source regions and drain regions can be formed by an epitaxial growth process that deposits a crystalline layer onto the crystalline substrate beneath. In some embodiments, epitaxial silicon, silicon germanium, and/or carbon doped silicon (Si:C) can be doped during deposition by adding a dopant or impurity to form a silicide. The epitaxial source/drain can be doped with an n-type dopant or a p-type dopant, which depends on the type of transistor. Alternatively, the source/drain regions can be formed by incorporating dopants into the substrate.

In vertical FETs, the gate metal/poly deposition can be performed around a vertical pillar that forms the source/channel/drain. The gate structure includes a high-k gate dielectric. High-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum.

The high-k dielectric material layer can be formed by known deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

Work function metals, including polysilicon, for a gate can be disposed over the high-k dielectric material layer. The type of work function metal can depend on the type of transistor and may differ between the NFET and the PFET. Non-limiting examples of suitable work function metals include p-type work function metal materials and n-type work function metal materials. P-type work function materials can include compositions such as ruthenium, palladium, platinum, cobalt, nickel, and conductive metal oxides, or any combination thereof. N-type metal materials can include compositions such as hafnium, zirconium, titanium, tantalum, aluminum, metal carbides (e.g., hafnium carbide, zirconium carbide, titanium carbide, and aluminum carbide), aluminides, or any combination thereof.

Conventional methods for forming the conductive elements, tracks thereto, and via elements in the circuits are contemplated. One or more layers of inter-level dielectric materials can be deposited between circuit levels. Openings or via elements can be formed through the inter-level dielectrics and filled with a conductive material, as will be understood by the skilled artisan.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A logic circuit comprising vertical transport field effect transistors and one or more active gates, wherein the number of (cell gate pitch) $C_{PP}$'s for the logic circuit, in isolation, is equal to the number of active gates,
   wherein the logic circuit is a logic gate selected from the group consisting of:
   one-$C_{PP}$ inverter comprising only one active gate;
   two-$C_{PP}$ NOR logic gates comprising only two active gates;
   three-$C_{PP}$ NAND logic gates comprising only three active gates; and combinations thereof; and wherein:
   the two-$C_{PP}$ double-width vertical transport inverter provides a function equivalent to a three-$C_{PP}$ inverter in which the vertical transport field effect transistors are lateral and planar in configuration;
   the two-$C_{PP}$ NOR vertical transport logic gate provides a function equivalent to a four-$C_{PP}$ NOR logic gate in which the vertical transport field effect transistors are lateral and planar in configuration; and
   the three-$C_{PP}$ NAND vertical transport logic gate provides a function equivalent to a five-$C_{PP}$ logic gate in which the vertical transport field effect transistors are planar and lateral in configuration.

2. A logic circuit comprising:
   a first vertical transport field effect transistor and a second vertical transport field effect transistor, each having source/drain regions on vertically opposing sides of a gate structure and a vertical fin extending vertically upwards with respect to a supporting substrate of a vertical inverter, from a bottom source/drain region to a top drain/source region;
   one or more gate structures;
   wherein components of the logic circuit are present in at least three different and distinct vertical levels, a Level FET comprising a horizontal plane passing through the fins of the first and second vertical transport field effect transistors, Circuit Level M1, and Circuit Level M2;
   wherein Circuit Level M1 comprises at least one horizontal plane through at least one conductive element that provides an input voltage to the one or more gate structures and another conductive element that provides an output voltage of the logic circuit;
   wherein Circuit Level M2 comprises a horizontal plane through at least one conductive element that forms a conductive bridge from N output to P output of the field effect transistors; and
   wherein Circuit Level M2 is vertically above and separate from Circuit Level M1, and wherein Circuit Level M1 is vertically above and separate from Level FET.

3. The logic circuit of claim 2, wherein the logic circuit comprises a logic gate selected from the group consisting of one-$C_{PP}$ vertical transport inverter, two-$C_{PP}$ double width vertical transport inverter, two-$C_{PP}$ NOR vertical transport logic gate, and three-$C_{PP}$ NAND vertical transport logic gate, and combinations thereof, wherein:
   the two-$C_{PP}$ double width vertical transport inverter provides a function equivalent to a three-$C_{PP}$ inverter in which the field effect transistors are planar; and
   wherein the three-$C_{PP}$ NAND vertical transport logic gate provides a function equivalent to a five-$C_{PP}$ logic gate in which the field effect transistors are planar.

4. The logic circuit of claim 2, wherein Circuit Level M1 is located vertically above a Circuit Level M0 and below Circuit Level M2, wherein Circuit Level M0 comprises conductive elements connected to contacts in trenches in top source/drain regions and contacts in trenches in bottom source/drain regions.

5. The logic circuit of claim 2, wherein one or more via elements are vertically located between, and electrically connected, to conductive elements in both Circuit Levels M1 and M2.

6. The logic circuit of claim 2, wherein Circuit Level M1 comprises one or all of the following components: a conductive element electrically connected in the same level to ground and power, a conductive element electrically connected in the same level to a voltage output, and a conductive element electrically connected in the same level to a voltage input to the gate.

7. The logic circuit of claim 2, further comprising a Circuit Level M0 comprising a vertical portion of the logic circuit above Level FET and below Circuit Level M1, which Circuit Level M0 comprises a horizontal plane through at least one of the conductive elements in the level, which conductive elements in Circuit Level M0 comprise at least one, or all, of the following components: a conductive element indirectly connected, at a higher level, to ground, power, input, output, and a conductive bridge from the N output to P output.

8. The logic circuit of claim 7, wherein Level FET is located vertically below Circuit Level M0, and wherein at least one conductive via is vertically located between Level FET and Circuit Level M0.

9. The logic circuit of claim 2, wherein Level FET comprises at least one horizontal plane through the fins or gates of the vertical transport field effect transistors.

10. The logic circuit of claim 2, wherein the vertical transport in the logic circuit is, from a bottom S/D region, in order from lower to upper levels, as follows: a contact with a bottom S/D region to, through a via element, a conductive element in Circuit Level M0 and, through another via element, to a conductive element in Circuit Level M1 and thereafter to ground and power.

11. The logic circuit of claim 2, wherein the vertical transport in the logic circuit is, in order from the top S/D regions, as follows: a conductive element in Circuit Level M0 and, through a via element, a conductive element in Circuit Level M1 and, through another via element, a conductive element bridging and connecting N output to P output.

12. The logic circuit of claim 2, comprising a vertical transport NOR logic gate that comprises first and second gate structures and, at Circuit level M1, two voltage inputs, respectively, to the first and second gate structures.

13. The logic circuit of claim 2, comprising a NAND logic gate having three separate gate structures and a plurality of VTFETs.

14. A NOR vertical transport logic circuit comprising:
   four vertical transport field effect transistors, each having source/drain regions on vertically opposing sides of a gate structure and a vertical fin extending vertically upwards with respect to a supporting substrate of the logic circuit, from a bottom source/drain region to a top drain/source region;
   two separate gate structures having different inputs;
   wherein components of the NOR vertical transport logic circuit are present in at least three different vertical levels, a Level FET comprising at least one horizontal plane through the fins or gates of the vertical transport field effect transistors, Circuit Level M1, and Circuit Level M2;

wherein Circuit Level M1 comprises at least one horizontal plane through a conductive element that provides an input voltage to the gate structures and another conductive element that provides an output voltage of the logic circuit;

wherein Circuit Level M2 comprises a horizontal plane through at least one conductive element that forms a conductive bridge from N output to P output of the field effect transistors; and wherein Circuit Level M2 is vertically above and separate from Circuit Level M1, and wherein Circuit Level M1 is vertically above Level FET.

15. The NOR vertical transport logic circuit of claim 14, wherein the circuit is a two-$C_{PP}$ logic gate that is equivalent in function to a four-$C_{PP}$ NOR logic gate in which the field effect transistors are planar.

16. The NOR vertical transport logic circuit of claim 14, wherein the logic circuit is a NAND3 vertical transport logic circuit comprising:

a plurality of vertical transport field effect transistors, each having source/drain regions on vertically opposing sides of a gate structure and a vertical fin extending vertically upwards, with respect to the supporting substrate of the vertical inverter, from a bottom source/drain region to a top drain/source region;

three separate gate structures each having different inputs;

wherein components of the inverter circuit are present in at least three different vertical levels, a Level FET comprising at least one horizontal plane passing through the fins of the vertical transport field effect transistors, Circuit Level M1, and Circuit Level M2;

wherein Circuit Level M1 comprises at least one horizontal plane passing through a conductive element that provides an input voltage to at least one, or all, of the gate structures and another conductive element that provides an output voltage of the inverter circuit;

wherein Circuit Level M2 comprises a horizontal plane through at least one conductive element that forms a conductive bridge from the N output to P output of the field effect transistors; and wherein Circuit Level M2 is vertically above and separate from Circuit Level M1, and wherein Circuit Level M1 is vertically above Level FET.

17. The NOR vertical transport logic circuit of claim 16, wherein the NAND vertical transport logic circuit is a three-$C_{PP}$ logic gate that is equivalent in function to a five-$C_{PP}$ logic gate in which the field effect transistors are planar.

18. The NOR vertical transport of claim 16, wherein isolation gates are absent.

* * * * *